(12) United States Patent
Kobayashi et al.

(10) Patent No.: US 7,898,084 B2
(45) Date of Patent: Mar. 1, 2011

(54) SEMICONDUCTOR DEVICE

(75) Inventors: Takayo Kobayashi, Yokohama (JP); Takamasa Usui, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 389 days.

(21) Appl. No.: 11/333,361

(22) Filed: Jan. 18, 2006

(65) Prior Publication Data

US 2006/0170109 A1 Aug. 3, 2006

(30) Foreign Application Priority Data

Jan. 18, 2005 (JP) .................................. 2005-010732

(51) Int. Cl.
*H01L 23/52* (2006.01)
*H01L 23/48* (2006.01)

(52) U.S. Cl. ......... 257/758; 257/774; 257/773; 257/751; 257/762

(58) Field of Classification Search ............... 257/758, 257/773, 774, 762, 751
See application file for complete search history.

(56) References Cited

U.S. PATENT DOCUMENTS

| 6,958,542 | B2 * | 10/2005 | Hasunuma et al. | 257/758 |
|---|---|---|---|---|
| 6,960,834 | B2 * | 11/2005 | Nakamura et al. | 257/758 |
| 7,323,781 | B2 * | 1/2008 | Noguchi et al. | 257/758 |
| 2004/0140564 | A1 * | 7/2004 | Lee et al. | 257/758 |
| 2005/0029669 | A1 * | 2/2005 | Inoue et al. | 257/774 |

FOREIGN PATENT DOCUMENTS

| JP | 11-74271 | 3/1999 |
|---|---|---|
| JP | 2003-152077 | 5/2003 |
| JP | 2000-119969 | 4/2004 |
| JP | 2004-253688 | 9/2004 |
| JP | 2004-273523 | 9/2004 |
| JP | 2004-356315 | 12/2004 |

OTHER PUBLICATIONS

Yao, et al., "Numerical Characterization of the Stress Induced Voiding Inside Via of Various Cu/Low k Interconnects", Advanced Module Technology Division, R&D, Taiwan Semiconductor Manufacturing Co., Ltd., pp. 1-3, (2004).

Office Action from Japanese Patent Office mailed on May 19, 2009 for counterpart Japanese Patent Application No. 2005-010732.

Notice of Reasons for Rejection dated Mar. 17, 2010, from Japanese Patent Office in corresponding Japanese application No. 2005-010732.

* cited by examiner

*Primary Examiner* — Kenneth A Parker
*Assistant Examiner* — Joseph Nguyen
(74) *Attorney, Agent, or Firm* — Finnegan, Henderson, Farabow, Garrett & Dunner, L.L.P.

(57) ABSTRACT

A semiconductor device is disclosed, which includes a first interlayer insulating film, a lower-layer interconnection in a first groove in the first film, a second interlayer insulating film over the first film, having a normal via hole opening to the lower-layer interconnection, a normal plug in the normal hole, a third interlayer insulating film over the second film, having a second groove opening to the normal plug, an upper-layer interconnection in the second groove, and a first dummy plug in a first dummy via hole in the second film, the first dummy via hole opening to one of the lower-layer and upper-layer interconnections, wherein a short side of the first dummy plug is larger than a minimum width of a minimum width interconnection and smaller than a minimum diameter of a minimum diameter via hole and a long side is larger than a shortest length of a shortest length interconnection.

17 Claims, 6 Drawing Sheets

SEMICONDUCTOR DEVICE

CROSS-REFERENCE TO RELATED APPLICATIONS

This application is based upon and claims the benefit of priority from prior Japanese Patent Application No. 2005-010732, filed Jan. 18, 2005, the entire contents of which are incorporated herein by reference.

BACKGROUND OF THE INVENTION

1. Field of the Invention

The present invention relates to a multilayer interconnection structure semiconductor device adopting damascene technology, which prevents degradation of reliability of the interconnection due to stress migration (SM).

2. Description of the Related Art

When a semiconductor device having a damascene interconnection is continuously in operation for a long time, a stress migration is generated due to generated heat, which generates voids in a via contact or in a lower-layer interconnection portion under the via contact. The generation of voids decreases the reliability of the damascene interconnection reliability. Conventionally, a multi via plug in which plural via plugs are formed in the same connection portion of the interconnection is used in order to prevent the deterioration of damascene interconnection reliability due to the stress migration (see Jpn. Pat. Appln. KOKAI Publication No. 11-74271). There is also proposed a structure having plural dummy via plugs (see Jpn. Pat. Appln. KOKAI Publication No. 2000-119969). However, in such conventional methods, there is a possibility that voids are generated in the via plug to be connected or in the lower-layer interconnection portion under the via contact to be connected, and the deterioration of the damascene interconnection reliability is not sufficiently prevented.

BRIEF SUMMARY OF THE INVENTION

According to a first aspect of the present invention, there is provided a semiconductor device comprising:

a first interlayer insulating film formed on a semiconductor substrate;

a lower-layer interconnection formed in a first groove formed in the first interlayer insulating film;

a second interlayer insulating film formed on the first interlayer insulating film and the lower-layer interconnection, the second interlayer insulating film having formed therein a normal via hole opening to the lower-layer interconnection;

a normal plug formed in the normal via hole;

a third interlayer insulating film formed on the second interlayer insulating film and the normal plug, the third interlayer insulating film having formed therein a second groove opening to the normal plug;

an upper-layer interconnection formed in the second groove formed in the third interlayer insulating film; and a first dummy plug embedded in a first dummy via hole formed in the second interlayer insulating film, the first dummy via hole opening to one of the lower-layer interconnection and the upper-layer interconnection, wherein a short side of the first dummy plug in a plan pattern is larger than a minimum width of a minimum width interconnection and smaller than a minimum diameter of a minimum diameter via hole and a long side of the first dummy plug in the plan pattern is larger than a shortest length of a shortest length interconnection.

According to a second aspect of the present invention, there is provided a semiconductor device comprising:

a first interlayer insulating film formed on a semiconductor substrate;

a lower-layer interconnection formed in a first groove formed in the first interlayer insulating film;

a second interlayer insulating film formed on the first interlayer insulating film and the lower-layer interconnection, the second interlayer insulating film having a normal via hole, a dummy via hole, and a second groove, the normal via hole and the dummy via hole opening to the lower-layer interconnection, and the second groove opening to the normal via hole;

an upper-layer interconnection formed in the normal via hole and the second groove formed in the second interlayer insulating film; and a dummy plug embedded in the dummy via hole formed in the second interlayer insulating film, wherein a short side of the dummy plug in a plan pattern is larger than a minimum width of a minimum width interconnection and smaller than a minimum diameter of a minimum diameter via hole and a long side of the dummy plug in the plan pattern is larger than a shortest length of a shortest length interconnection.

According to a third aspect of the present invention, there is provided a semiconductor device comprising:

a first interlayer insulating film formed on a semiconductor substrate;

a first plug formed in a first via hole formed in the first interlayer insulating film;

a second interlayer insulating film formed on the first interlayer insulating film and the first plug;

a normal interconnection formed in a first groove formed in the second interlayer insulating film and connected to the first plug;

a second plug formed on the normal interconnection formed in the second interlayer insulating film; and a dummy interconnection formed in a second groove formed in a region of the second interlayer insulating film, which corresponds to other region than those where the first plug and the second plug are formed, the dummy interconnection being connected to a first embedded metal of the normal interconnection, wherein the dummy interconnection has a width which is smaller than a minimum width of a minimum width interconnection.

DETAILED DESCRIPTION OF THE INVENTION

Embodiments of the present invention will be described below with reference to the accompanying drawings.

FIG. 1 to FIG. 6 are sectional views of a semiconductor device in manufacturing processes according to a first embodiment of the present invention. FIG. 7 shows a plan pattern of a dummy plug 22b formed in a slit-shaped dummy via hole 19b of the semiconductor device according to the first embodiment of the present invention.

Figure 1:
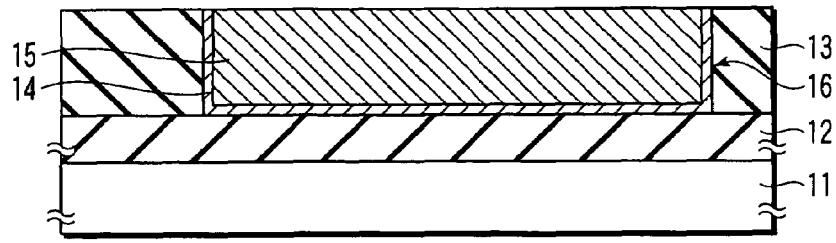
FIG. 1 is a cross sectional view of a semiconductor device in a manufacturing process according to a first embodiment of the present invention.

Referring to FIG. 1, a first interlayer insulating film 12 is formed on a semiconductor substrate 11. A second interlayer insulating film 13 is formed on the first interlayer insulating film 12. A lower-layer interconnection 16 composed of a first barrier metal layer 14 and a first embedded metal layer 15 is formed in the second interlayer insulating film 13 by the damascene method. For example, the first barrier metal layer 14 is made of Ti (titanium) and the first embedded metal layer 15 is made of Cu (copper).

Figure 2:
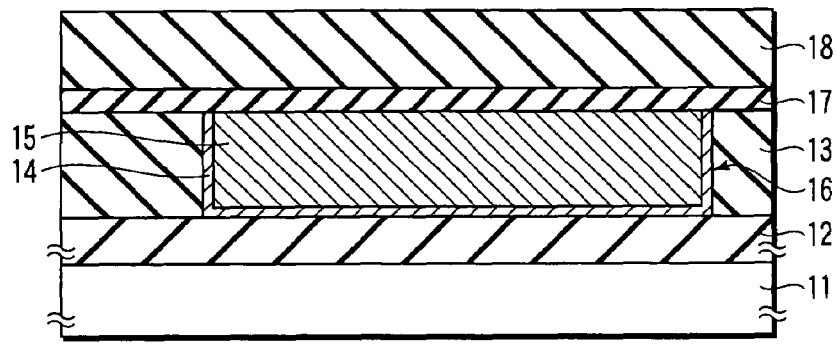
FIG. 2 is a cross sectional view of the semiconductor device in a manufacturing process following the manufacturing process of FIG. 1, according to the first embodiment of the present invention.

Referring to FIG. 2, a Cu diffusion preventing insulating film 17 is deposited on the lower-layer interconnection 16 and the second interlayer insulating film 13 in order to prevent Cu diffusion from the embedded metal layer 15. A third interlayer insulating film 18 is deposited on the Cu diffusion preventing insulating film 17.

Figure 3:
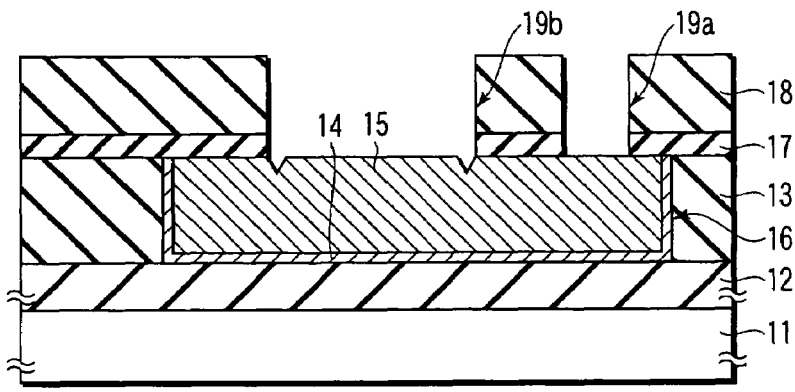
FIG. 3 is a cross sectional view of the semiconductor device in a manufacturing process following the manufacturing process of FIG. 2, according to the first embodiment of the present invention.

Referring to FIG. 3, a normal via hole 19a and a dummy via hole 19b are formed in the third interlayer insulating film 18 and the insulating film 17 by lithography. The normal via hole 19a and the dummy via hole 19b are provided on the lower-layer interconnection 16 to open to the lower-layer interconnection 16.

Referring to FIG. 7, the dummy via hole 19b has a slit shape in a plan pattern. The slit-shaped dummy via hole 19b is shown in the lengthwise direction thereof in FIG. 7. A short-side length of the slit-shaped dummy via hole 19b in the plan pattern is larger than a minimum width of a minimum width interconnection and smaller than a minimum diameter of a minimum-diameter via hole. A long-side length of the dummy via hole 19b in the plan pattern is larger than a shortest length of a shortest length interconnection. For example, when the minimum diameter of a minimum-diameter via hole is 120 nm in a certain generation, the interconnection of the same generation can be formed in the width of 90 nm and the length of 200 nm. The plan pattern of the normal via hole 19a is in a substantially circular shape which is of a general shape.

Since the dummy via hole 19b is patterned in the slit shape, etching is degraded in making the dummy via hole 19b by the lithography, which forms a portion broken by over-etching in a portion of the lower-layer interconnection 16 under a corner portion of a bottom portion of the slit-shaped dummy via hole 19b. That is, in order to create the portion broken by the over-etching in a portion of the lower-layer interconnection 16 under the corner portion of the bottom portion of the dummy via hole 19b, the plan pattern of the dummy via hole 19b is shaped in the slit shape and the dummy via hole 19b is defined in the above dimensions.

Figure 4:
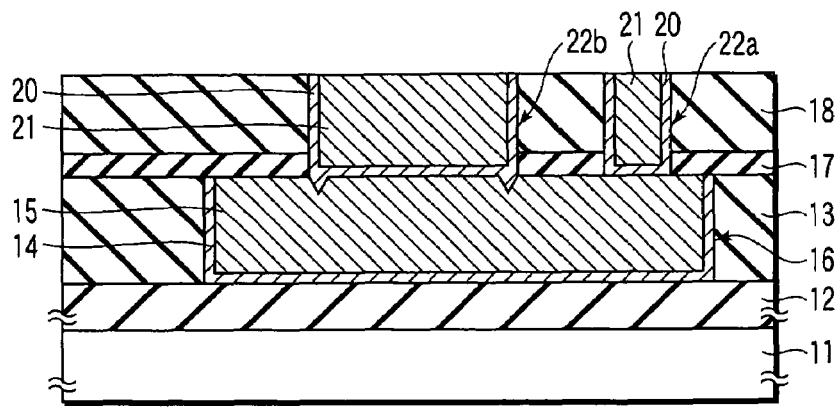
FIG. 4 is a cross sectional view of the semiconductor device in a manufacturing process following the manufacturing process of FIG. 3, according to the first embodiment of the present invention.

Referring to FIG. 4, a normal plug 22a and a dummy plug 22b are formed in the normal via hole 19a and the dummy via hole 19b, respectively, by the damascene method. Each of the normal plug 22a and the dummy plug 22b is comprised of a second barrier metal layer 20 and a second embedded metal layer 21. For example, the second barrier metal layer 20 is made of Ti like the first barrier metal layer 14, and the second embedded metal layer 21 is made of Cu like the first embedded metal layer 15.

As described above, since the short-side length of the slit-shaped dummy via hole 19b in the plan pattern is larger than the minimum width of the minimum width interconnection and smaller than the minimum diameter of the minimum-diameter via hole, the short-side length of the slit-shaped dummy via plug 22b in the plan pattern also is larger than the minimum width of the minimum width interconnection and smaller than the minimum diameter of the minimum-diameter via hole. Also, as described above, since the long-side length of the dummy via hole 19b in the plan pattern is larger than the shortest length of the shortest length interconnection, the long-side length of the dummy plug 22b in the plan pattern is also larger than the shortest length of the shortest length interconnection.

Since the dummy via hole 19b has a slit shape in the plan pattern, it is difficult that a material of the second barrier metal layer 20 is uniformly formed into a deep portion of the dummy via hole 19b. Therefore, a film thickness of the barrier metal layer 20 formed on the surface of the dummy via hole 19b becomes uneven, and film quality becomes coarse. Consequently, bonding between the barrier metal layer 20 in the dummy via hole 19b and the third interlayer insulating film 18 is low. Also, bonding between the barrier metal layer 20 in the dummy via hole 19b and the Cu diffusion preventing insulating film 17 is low. Further, bonding between the barrier metal layer 20 in the dummy via hole 19b and the lower-layer interconnection 16 is low.

Since the dummy via hole 19b is in the slit shape, it is difficult that the material of the second metal layer 21 is satisfactorily embedded into the deep portion of the dummy via hole 19b. Therefore, the film quality of the second embedded metal layer 21 formed in the dummy via hole 19b becomes uneven and coarse. Therefore, the bonding between the second embedded metal layer 21 and the second barrier metal layer 20 in the dummy via hole 19b is low.

Figure 5:
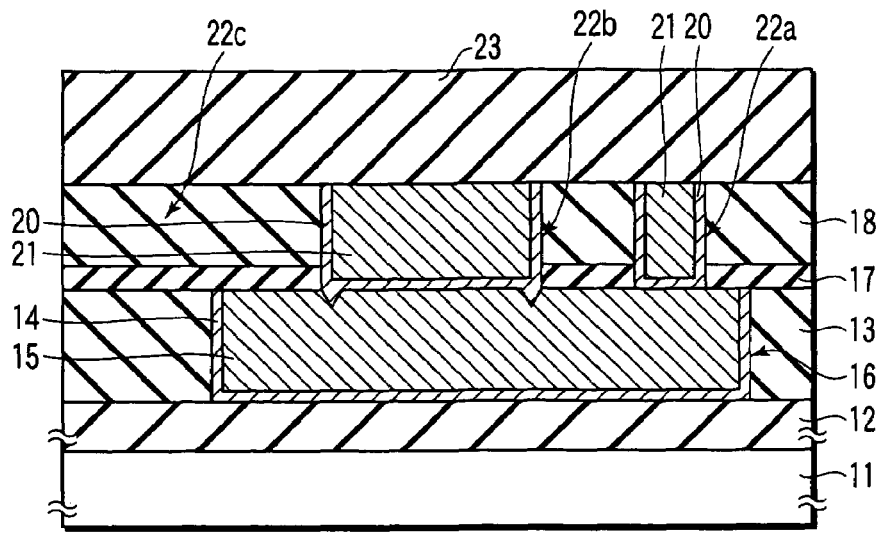
FIG. 5 is a cross sectional view of the semiconductor device in a manufacturing process following the manufacturing process of FIG. 4, according to the first embodiment of the present invention.

Referring to FIG. 5, a fourth interlayer insulating film 23 is deposited on the normal plug 22a, the dummy plug 22b, and the third interlayer insulating film 18.

Figure 6:
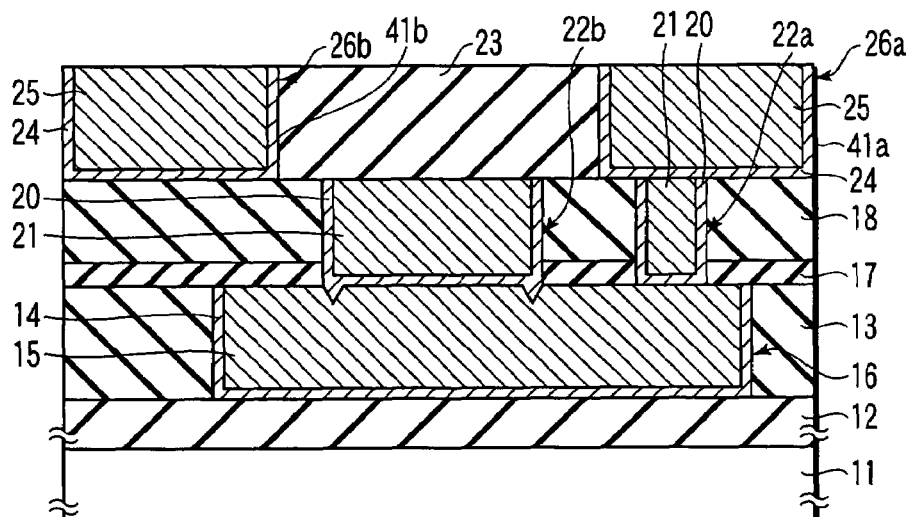
FIG. 6 is a cross sectional view of the semiconductor device in a manufacturing process following the manufacturing process of FIG. 5, according to the first embodiment of the present invention.
Figure 7:
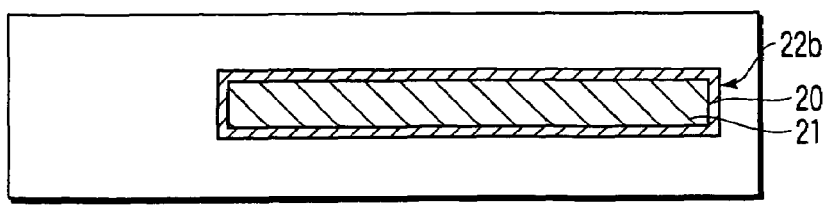
FIG. 7 shows a plan pattern of a dummy plug 22b formed in a slit-shaped dummy via hole 19b of the semiconductor device shown in FIG. 3 and FIG. 4y.

Referring to FIG. 6, interconnection grooves 41a and 41b are formed in the fourth interlayer insulating film 23. The interconnection grooves 41a and 41b are formed at portions of the fourth interlayer insulating film 23, which do not correspond to the dummy plug 22b. The interconnection groove 41a corresponds to the normal plug 22a and opens to the normal plug 22a. Then, upper-layer interconnections 26a and 26b are formed in the interconnection grooves 41a and 41b, respectively, by the damascene method. Each of the upper-layer interconnections 26a and 26b is formed of a third barrier metal layer 24 and a third embedded metal layer 25. Since the interconnection grooves 41a and 41b are formed at portions of the fourth interlayer insulating film 23, which do not correspond to the dummy plug 22b, the upper-layer interconnections 26a and 26b are not connected to the dummy plug 22b. Since the interconnection groove 41a opens to the normal plug 22a, the upper-layer interconnection 26a is connected to the normal plug 22a.

In the first embodiment, the slit-shaped dummy plug 22b is provided so that a portion of the lower-layer interconnection 16 under the corner portion of the bottom portion of the dummy plug 22b is damaged and broken by the over-etching. The stress migration easily occurs in the broken portion. The occurrence of the stress migration in the broken portion suppresses the generation of the stress migration in the normal plug 22a and in the portion of the lower-layer interconnection 16 under the corner portion of the bottom portion of the normal plug 22a. As a result, the generation of voids is suppressed in the normal plug 22a and in the portion of the lower-layer interconnection 16 under the corner portion of the bottom portion of the normal plug 22a, which allows the normal plug 22a to satisfactorily connect the lower-layer interconnection 16 to the upper-layer interconnection 25.

AS described above, according to the first embodiment, the slit-shaped dummy plug 22b is provided. As a result, the generation of the stress migration in the normal plug 22a and in the portion of the lower-layer interconnection 16 under the corner portion of the bottom portion of the normal plug 22a is suppressed, with the result that the generation of voids in the normal plug 22a and in the portion of the lower-layer interconnection 16 under the corner portions of the bottom portion of the normal plug 22a is suppressed. Accordingly, the normal plug 22a satisfactorily connects the lower-layer interconnection 16 to the upper-layer interconnection 25. This improves the reliability of the interconnection.

Figure 8:
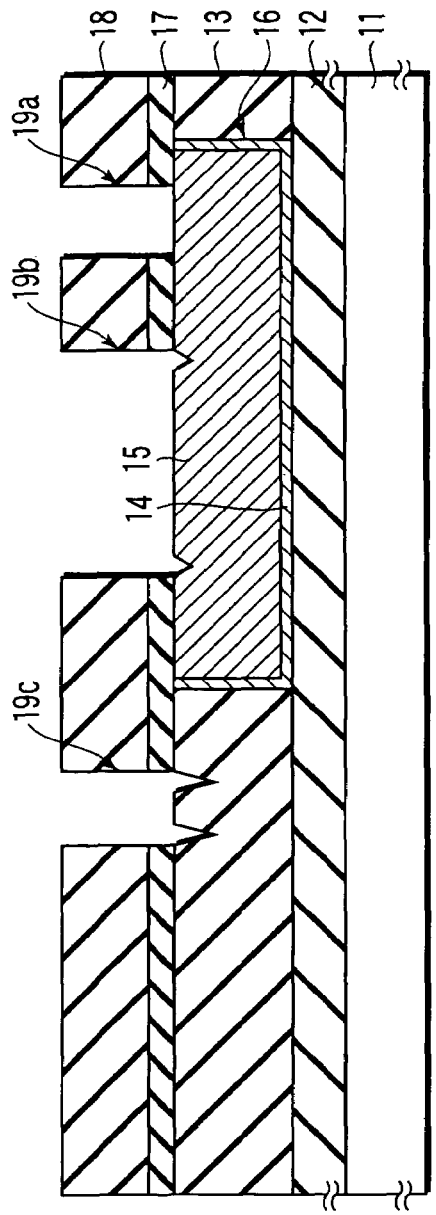
FIG. 8 is a cross sectional view of a semiconductor device in a manufacturing process according to a second embodiment of the present invention.
Figure 9:
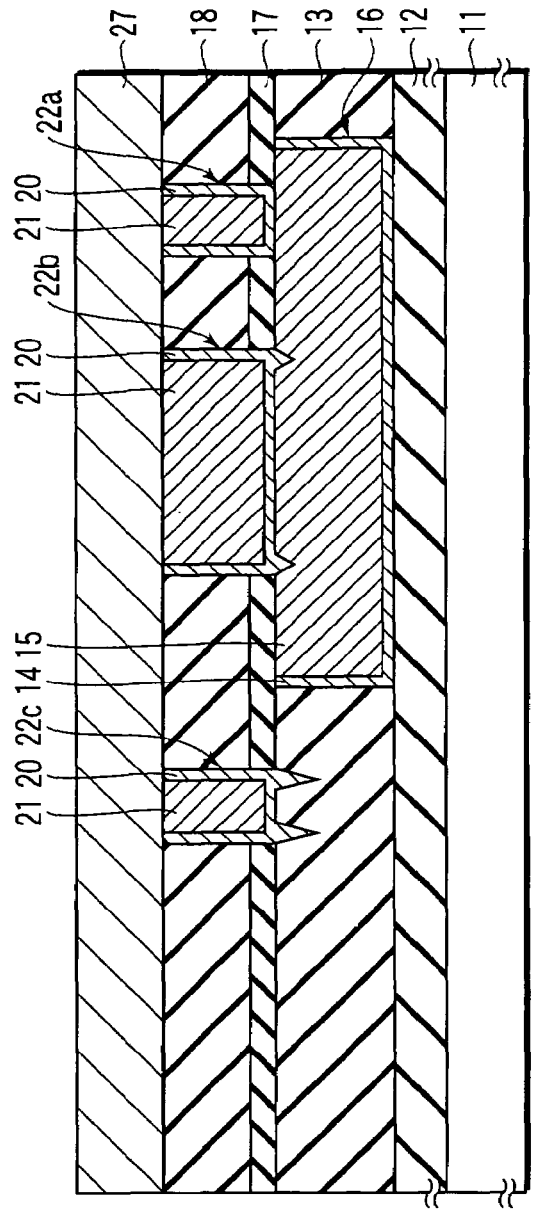
FIG. 9 is a cross sectional view of the semiconductor device in a manufacturing process following the manufacturing process of FIG. 8, according to the second embodiment of the present invention.

FIG. 8 and FIG. 9 are cross sectional views of a semiconductor device in a manufacturing process according to a second embodiment of the present invention. The same components as those in the first embodiment are designated by the same numerals, and the description will not be repeated.

In the second embodiment, as shown in FIG. 8, the normal via hole 19a and the dummy via hole 19b are formed in the third interlayer insulating film 18 by the lithography in the same manner as in the first embodiment. In the second embodiment, a dummy via hole 19c is formed. The dummy via hole 19c can be formed simultaneously with the normal via hole 19a and the dummy via hole 19b in the same lithography process. The normal via hole 19a and the dummy via hole 19b are formed on the lower-layer interconnection 16 and open to the lower-layer interconnection 16. The dummy via hole 19c is formed on the second interlayer insulating film 13 and opens to the second interlayer insulating film 13.

As described in the first embodiment, the dummy via hole 19b is shaped in a form of slit in the plan pattern. The short-side length of the slit-shaped dummy via hole 19b in the plan pattern is larger than the minimum width and smaller than the minimum width interconnection to the minimum diameter of the minimum-diameter via hole. The long-side length of the dummy via hole 19b in the plan pattern is larger than the shortest length of the shortest length interconnection. Similarly to the normal via hole 19a, the plan pattern of the dummy via hole 19c is made in the substantially circular shape which is the general shape. The dimensions of the dummy via hole 19c may be the same as or different from the dimensions of the normal via hole 19a. However, in order to simplify a mask manufacturing process, the dimensions of the dummy via hole 19c are preferably the same as the dimensions of the normal via hole 19a.

In the second embodiment, also, the portion broken by the over-etching is formed in the portion of the lower-layer interconnection 16 under the corner portion of the bottom portion of the slit-shaped dummy via hole 19b like the first embodiment.

Since the second interlayer insulating film 13 is etched more easily than the lower-layer interconnection 16, a portion of the second interlayer insulating film 13 under the corner portion of the bottom portion of the circular dummy via hole 19c is broken to form the broken portion by the over-etching in the lithography process.

Referring to FIG. 9, plugs 22a, 22b, and 22c are formed in the normal via hole 19a, the dummy via hole 19b, and the dummy via hole 19c, respectively, by the damascene method. Each of the plugs 22a, 22b, and 22c is composed of the second barrier metal layer 20 and the second embedded metal layer 21. The plug 22b and the plug 22c are dummy plugs.

As described in the first embodiment, since the dummy via hole 19b is made in the slit shape, it is difficult that the material of the second barrier metal layer 20 is uniformly formed into the deep portion of the dummy via hole 19b. Therefore, the film thickness of the barrier metal layer 20 formed on the surface of the dummy via hole 19b becomes uneven and the film quality also becomes coarse. Consequently, bonding between the barrier metal layer 20 in the dummy via hole 19b and the third interlayer insulating film 18 is low. Also, bonding between the barrier metal layer 20 in the dummy via hole 19b and the Cu diffusion preventing insulating film 17 is low. Further, bonding between the barrier metal layer 20 in the dummy via hole 19b and the lower-layer interconnection 16 is low.

Also, as described in the first embodiment, since the dummy via hole 19b is made in the slit shape, it is difficult that the material of the second metal layer 21 is satisfactorily embedded into the deep portion of the dummy via hole 19b. Therefore, the film quality of the second embedded metal layer 21 becomes coarse. Therefore, the bonding between the second embedded metal layer 21 and the second barrier metal layer 20 in the dummy via hole 19b is low.

In the second embodiment, as shown in FIG. 9, an upper-layer interconnection 27 is formed on the third interlayer insulating film 18 unlike the first embodiment, and the upper-layer interconnection 27 is connected to the normal plug 22a and the dummy plugs 22b and 22c. In the second embodiment, the same effects as those in the first embodiment are obtained by the dummy plug 22b. That is, in the second embodiment, the dummy plug 22b is provided so that a portion of the lower-layer interconnection 16 under the corner portion of the bottom portion of the dummy plug 22b is broken, with the result that the stress migration is generated by the broken portion. Therefore, the generation of the stress migration is suppressed in the portion of the lower-layer interconnection 16 under the bottom portion of the normal plug 22a and thus the void generation is suppressed in the normal plug 22a and in the portion of the lower-layer interconnection 16 under the corner portions of the bottom portion of the normal plug 22a.

Further, in the second embodiment, since the upper-layer interconnection 27 is connected to the dummy plug 22b, the stress migration is generated in the dummy plug 22b due to the coarseness of the dummy plug 22b, which generates voids in the dummy plug 22b. The generation of the stress migration in the dummy plug 22b further suppresses the generation of the stress migration in the normal plug 22a or in the portion of the lower-layer interconnection 16 of the bottom portion of the normal plug 22a, which suppresses the void generation in the normal plug 22a or in the portion of the lower-layer interconnection 16 of the bottom portion of the normal plug 22a.

Further, in the second embodiment, since the broken portion is formed in the portion of the second interlayer insulating film 13 under the corner portion of the bottom portion of the dummy plug 22c, the stress migration is also generated in the broken portion. Accordingly, the generation of the stress migration is further suppressed in the normal plug 22a or in the portion of the lower-layer interconnection 16 of the bottom portion of the normal plug 22a, with the result that the void generation in the normal plug 22a or in the portion of the lower-layer interconnection 16 of the bottom portion of the normal plug 22a is suppressed.

Thus, according to the second embodiment, provision of the dummy plug 22c further suppresses the generation of the stress migration in the normal plug 22a or in the portion of the lower-layer interconnection 16 under the bottom portion of the normal plug 22a. Therefore, the normal plug 22a further satisfactorily connects the lower-layer interconnection 16 to the upper-layer interconnection 25 to further improve the reliability of the interconnection.

Figure 10:
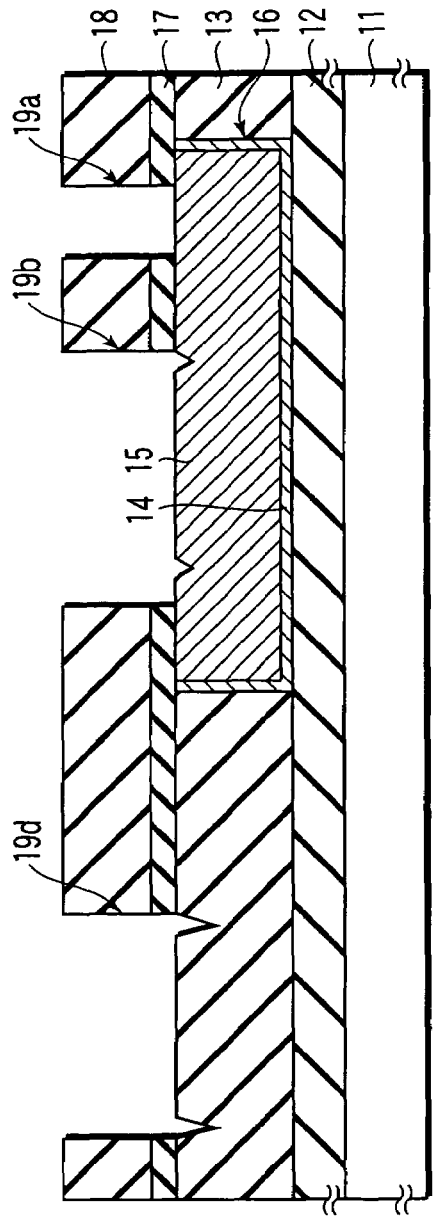
FIG. 10 is a cross sectional view of a semiconductor device in a manufacturing process according to a third embodiment of the present invention.
Figure 11:
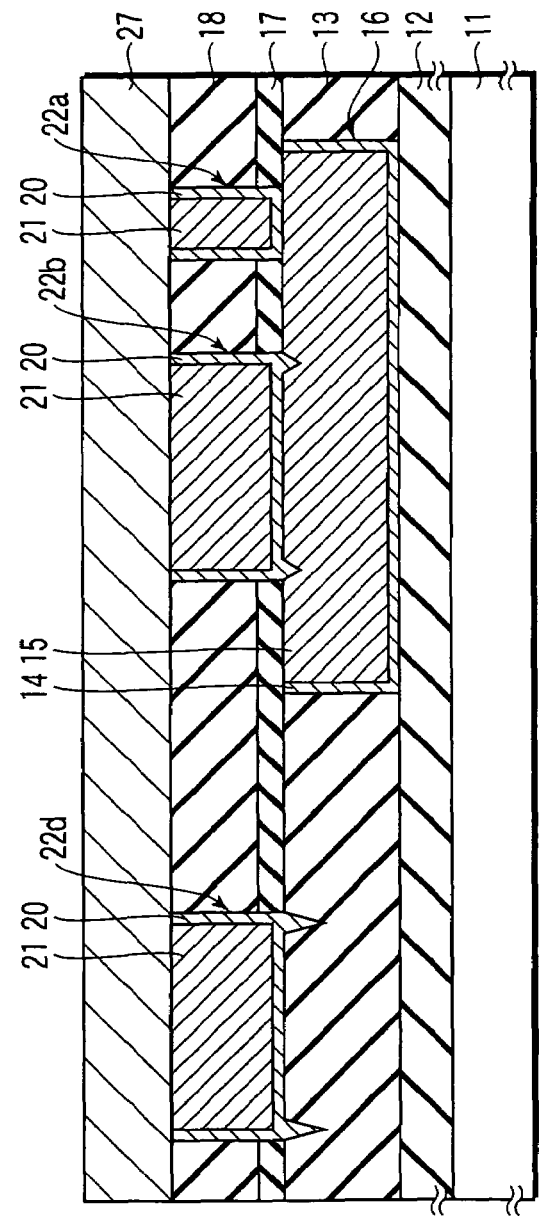
FIG. 11 is a cross sectional view of the semiconductor device in a manufacturing process following the manufacturing process of FIG. 10, according to the third embodiment of the present invention.

FIG. 10 and FIG. 11 are cross sectional views of a semiconductor device in a manufacturing process according to a third embodiment of the present invention. The same components as those in the first embodiment are designated by the same numerals, and the description will not be repeated.

In the third embodiment, as shown in FIG. 10, the normal via hole 19a and the dummy via hole 19b are formed in the third interlayer insulating film 18 by the lithography in the same manner as in the first embodiment. Also, in the third embodiment, a dummy via hole 19d is further formed. The dummy via hole 19d can be formed simultaneously with the normal via hole 19a and the dummy via hole 19b in the same lithography process. The normal via hole 19a and the dummy via hole 19b are formed on the lower-layer interconnection 16 and open to the lower-layer interconnection 16. The dummy via hole 19d is formed on the second interlayer insulating film 13 and opens to the second interlayer insulating film 13.

As described in the first embodiment, in the dummy via hole 19b, the plan pattern is made in the slit shape. The short-side length of the slit-shaped dummy via hole 19b in the plan pattern is larger than the minimum width of the minimum width interconnection and smaller than the minimum diameter of the minimum-diameter via hole. The long-side length of the dummy via hole 19b in the plan pattern is larger than the shortest length of the shortest length interconnection. The plan pattern of the normal via hole 19a is made in the substantially circular shape which is the general shape.

Similarly to the dummy via hole 19b, in the dummy via hole 19d, the plan pattern is made in the slit shape. Similarly to the slit-shaped dummy via hole 19b, the short-side length of the slit-shaped dummy via hole 19d in the plan pattern is larger than the minimum width of the minimum width interconnection and smaller than the minimum diameter of the minimum-diameter via hole. The long-side length of the dummy via hole 19d in the plan pattern is also larger than the shortest length of the shortest length interconnection. The dimensions of the via hole 19d may be the same as or different from the dimensions of the via hole 19b. However, in order to simplify the mask manufacturing process, the dimensions of the via hole 19c are preferably the same as the dimensions of the via hole 19b.

In the third embodiment, the portion broken by the over-etching is also formed in the portion of the lower-layer interconnection 16 under the corner portion of the bottom portion of the slit-shaped dummy via hole 19b during the lithography like the first embodiment.

In the third embodiment, the plan pattern of the dummy via hole 19d is also formed in the slit shape like the dummy via hole 19b, so that the portion of the second interlayer insulating film 13 under the corner portion of the bottom portion of the dummy via hole 19d is broken to generate the broken portion by the over-etching during the lithography of the dummy via hole 19d. Since the second interlayer insulating film 13 is etched more easily than the lower-layer interconnection 16, the broken portion formed in the portion of the second interlayer insulating film 13 under the corner portion of the bottom portion of the dummy via hole 19d is deeper than the broken portion formed in the portion of the second interlayer insulating film 13 of the dummy via hole 19b.

The plugs 22a, 22b, and 22d are formed in the normal via hole 19a, the dummy via hole 19b, and the dummy via hole 19d by the damascene method. Each of the plugs 22a, 22b, and 22d is comprised of the second barrier metal layer 20 and the embedded metal layer 21. The plug 22b and the plug 22d are the dummy plugs.

As described in the first embodiment, since the dummy via hole 19b is made in the slit shape, it is difficult that the material of the second barrier metal layer 20 is uniformly formed into the deep portion of the dummy via hole 19b. Therefore, the film thickness of the barrier metal layer 20 formed on the surface of the dummy via hole 19b becomes uneven and the film quality also becomes coarse. Consequently, bonding between the barrier metal layer 20 in the dummy via hole 19b and the third interlayer insulating film 18 is low. Also, bonding between the barrier metal layer 20 in the dummy via hole 19b and the Cu diffusion preventing insulating film 17 is low. Further, bonding between the barrier metal layer 20 in the dummy via hole 19b and the lower-layer interconnection 16 is low.

Also, as described in the first embodiment, since the dummy via hole 19b is made in the slit shape, it is difficult that the material of the second metal layer 21 is satisfactorily embedded into the deep portion of the dummy via hole 19b. Therefore, the film quality of the second embedded metal layer 21 formed in the dummy via hole 19b becomes coarse. Consequently, the bonding between the second embedded metal layer 21 and the second barrier metal layer 20 in the dummy via hole 19b is low.

As described above, since the dummy via hole 19d is made in the slit shape like the dummy via hole 19b, it is difficult that the material of the second barrier metal layer 20 is uniformly formed into the deep portion of the dummy via hole 19b. Therefore, the film thickness of the barrier metal layer 20 formed on the surface of the dummy via hole 19d becomes uneven and the film quality also becomes coarse. Consequently, bonding between the barrier metal layer 20 in the dummy via hole 19d and the third interlayer insulating film 18 is low. Also, bonding between the barrier metal layer 20 in the dummy via hole 19d and the Cu diffusion preventing insulating film 17 is low. Further, bonding between the barrier metal layer 20 in the dummy via hole 19d and the lower-layer interconnection 16 is low. It is also difficult that the material of the second embedded metal layer 21 is satisfactorily embedded into the deep portion of the dummy via hole 19d. Therefore, the film quality of the second embedded metal layer 21 in the dummy via hole 19d becomes non-dense. Consequently, the bonding between the second embedded metal layer 21 and the second barrier metal layer 20 in the dummy via hole 19d is low.

In the third embodiment, as shown in FIG. 10, the upper-layer interconnection 27 is formed on the third interlayer insulating film 18 unlike the first embodiment, and the upper-layer interconnection 27 is connected to the normal plug 22a and the dummy plugs 22b and 22d.

In the third embodiment, the same effects as those in the first embodiment are obtained by the dummy plug 22b. That is, provision of the dummy plug 22b creates the broken portion in the portion of the lower-layer interconnection 16 under the corner portion of the bottom portion of the dummy plug 22b, and the stress migration is generated by the broken portion. Therefore, the generation of the stress migration is suppressed in the portion of the lower-layer interconnection 16 of the bottom portion of the normal plug 22a and the void generation is suppressed in the normal plug 22a or in the portion of the lower-layer interconnection 16 under the corner portions of the bottom portion of the normal plug 22a.

Further, in the third embodiment, since the upper-layer interconnection 27 is connected to the dummy plug 22b, the stress migration is generated in the dummy plug 22b due to the coarseness of the dummy plug 22b, which generates the void in the dummy plug 22b. The generation of the stress migration in the dummy plug 22b suppresses the generation of the stress migration in the normal plug 22a or in the portion of the lower-layer interconnection 16 of the bottom portion of the normal plug 22a, which suppresses the void generation in the normal plug 22a or in the portion of the lower-layer interconnection 16 under the corner portion of the bottom portion of the normal plug 22a.

Further, in the third embodiment, since the broken portion is formed in the portion of the second interlayer insulating film 13 under the corner portion of the bottom portion of the dummy plug 22d, the stress migration is also generated in the broken portion. Since the broken portion formed in the portion of the second interlayer insulating film 13 under the corner portion of the bottom portion of the dummy plug 22d is larger than the broken portion formed in the portion of the lower-layer interconnection 16 under the corner portion of the bottom portion of the plug 22b, the large stress migration is generated in the broken portion in the portion of the second interlayer insulating film 13 under the corner portion of the bottom portion of the dummy plug 22d. As a result, the generation of the stress migration is further suppressed in the normal plug 22a or in the portion of the lower-layer interconnection 16 under the corner portion of the bottom portion of the normal plug 22a, which suppresses the void generation in the normal plug 22a or in the portion of the lower-layer interconnection 16 under the corner portion of the bottom portion of the normal plug 22a. Since the upper-layer interconnection 27 is connected to the dummy plug 22d, the stress migration toward the upper-layer interconnection 27 is generated in the dummy plug 22d due to the coarseness of the dummy plug 22d, which induces the void in the dummy plug 22d. As a result, the generation of the stress migration is further suppressed in the normal plug 22a and in the portion of the lower-layer interconnection 16 under the corner portion of the bottom portion of the normal plug 22a and the void generation is suppressed in the normal plug 22a and in the portion of the lower-layer interconnection 16 under the corner portion of the bottom portion of the normal plug 22a. This allows the normal plug 22a to further satisfactorily connect the lower-layer interconnection 16 and the upper-layer interconnection 25 to further improve the reliability of the interconnection.

Figure 12:
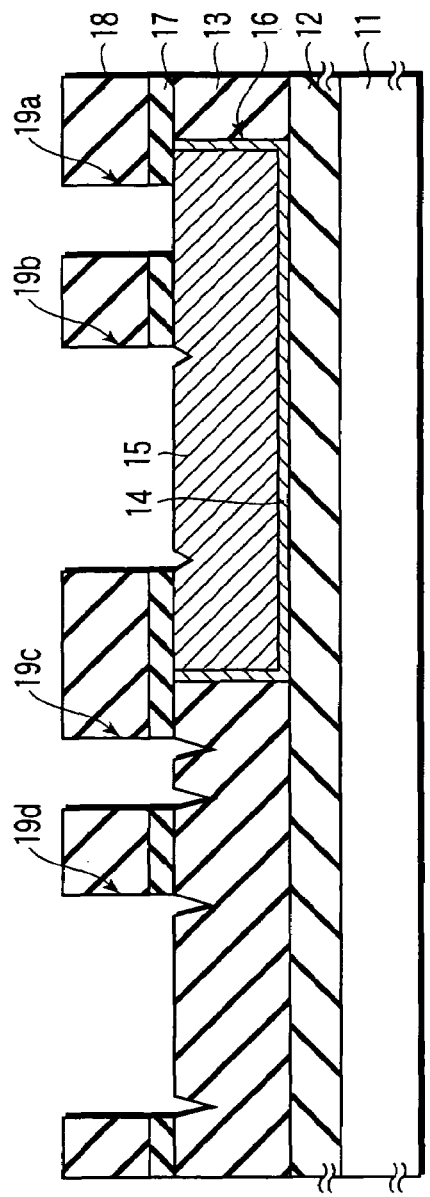
FIG. 12 is a cross sectional view of a semiconductor device in a manufacturing process according to a fourth embodiment of the present invention.
Figure 13:
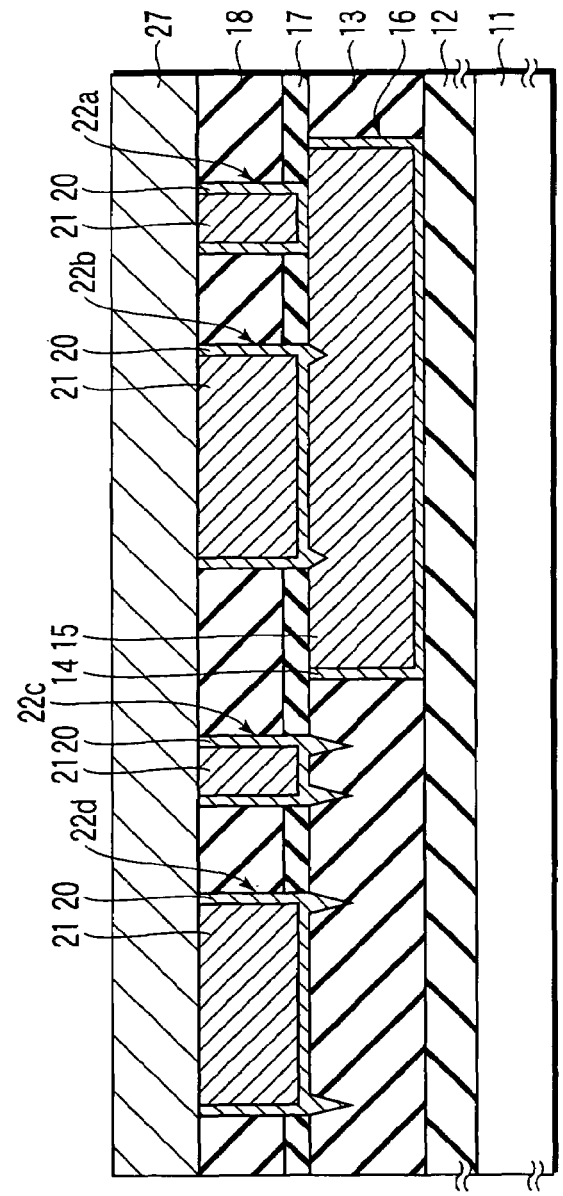
FIG. 13 is a cross sectional view of the semiconductor device in a manufacturing process following the manufacturing process of FIG. 12, according to the fourth embodiment of the present invention.

FIG. 12 and FIG. 13 are cross sectional views of a semiconductor device in a manufacturing process according to a fourth embodiment of the invention. The same components as those in the first, second, and third embodiments are designated by the same numerals, and the description will not be repeated.

In the fourth embodiment, as shown in FIG. 12, the normal via hole 19a and the dummy via hole 19b are formed in the third interlayer insulating film 18 by the lithography in the same manner as in the first embodiment. Dummy via holes 19c and 19d are also formed in the fourth embodiment. The dummy via holes 19c and 19d can be formed simultaneously with the normal via hole 19a and the dummy via hole 19b in the same lithography process. The normal via hole 19a and the dummy via hole 19b are formed on the lower-layer interconnection 16 and open to the lower-layer interconnection 16. The dummy via holes 19c and 19d are formed on the second interlayer insulating film 13 and open to the second interlayer insulating film 13.

As described in the first embodiment, in the dummy via hole 19b, the plan pattern is made in the slit shape. The short-side length of the slit-shaped dummy via hole 19b in the plan pattern also is larger than the minimum width of the minimum width interconnection and smaller than the minimum diameter of the minimum-diameter via hole. The long-side length of the dummy via hole 19b in the plan pattern is also larger than the shortest length of the shortest length interconnection. The plan pattern of the normal via hole 19a is made in the substantially circular shape which is of the general shape.

As described in the second embodiment, the plan pattern of the dummy via hole 19c is made in the substantially circular shape like the normal via hole 19a. The dimensions of the dummy via hole 19c may be same as or different from the dimensions of the normal via hole 19a. However, in order to simplify the mask producing process, the dimensions of the dummy via hole 19c are preferably the same as the dimensions of the normal via hole 19a. As described in the third embodiment, the plan pattern of the dummy via hole 19d is made in the slit shape like the dummy via hole 19b. Similarly to the slit-shaped dummy via hole 19b, the short-side length of the slit-shaped dummy via hole 19d in the plan pattern also is larger than the minimum width of the minimum width interconnection and smaller than the minimum diameter of the minimum-diameter via hole. The long-side length of the dummy via hole 19d in the plan pattern is also larger than the shortest length of the shortest length interconnection. The dimensions of the dummy via hole 19d may be the same as or different from the dimensions of the via hole 19b. However, in order to simplify the mask producing process, the dimensions of the dummy via hole 19d are preferably the same as the dimensions of the via hole 19b.

Similarly to the first embodiment, the portion of the lower-layer interconnection 16 under the corner portion of the bottom portion of the slit-shaped dummy via hole 19b is broken by the over-etching to form the broken portion in the lithography.

As described in the second embodiment, the portion of the second interlayer insulating film 13 under the corner portion of the bottom portion of the circular dummy via hole 19c is also broken by the over-etching to form the broken portion in the lithography. Since the second interlayer insulating film 13 is etched more easily than the lower-layer interconnection 16, the broken portion formed in the portion of the second interlayer insulating film 13 under the corner portion of the bottom portion of the dummy via hole 19c is larger than the broken portion formed in the portion of second interlayer insulating film 13 of the normal via hole 19a.

In the fourth embodiment, the plan pattern of the dummy via hole 19d is also formed in the slit shape like the dummy via hole 19b, so that the portion of the second interlayer insulating film 13 under the corner portion of the bottom portion of the dummy via hole 19d is broken to generate the broken portion by the over-etching during the lithography of the dummy via hole 19d. Since the second interlayer insulating film 13 is etched more easily than the lower-layer interconnection 16, the broken portion formed in the portion of the second interlayer insulating film 13 under the corner portion of the bottom portion of the dummy via hole 19d is deeper than the broken portion formed in the portion of the second interlayer insulating film 13 of the dummy via hole 19b.

As shown in FIG. 13, the plugs 22a, 22b, 22c, and 22d are formed in the normal via hole 19a, the dummy via hole 19b, the dummy via hole 19c, and the dummy via hole 19d by the damascene method. Each of the plugs 22a, 22b, 22c, and 22d is formed of the second barrier metal layer 20 and the second embedded metal layer 21. The plugs 22b, 22d, and 22d are the dummy plugs.

As described in the first embodiment, since the dummy via hole 19b has a slit shape in the plan pattern, it is difficult that a material of the second barrier metal layer 20 is uniformly formed into the deep portion of the dummy via hole 19b. Therefore, a film thickness of the barrier metal layer 20 formed on the surface of the dummy via hole 19b becomes uneven, and film quality becomes coarse. Consequently, bonding between the barrier metal layer 20 in the dummy via hole 19b and the third interlayer insulating film 18 is low. Also, bonding between the barrier metal layer 20 in the dummy via hole 19b and the Cu diffusion preventing insulating film 17 is low. Further, bonding between the barrier metal layer 20 in the dummy via hole 19b and the lower-layer interconnection 16 is low.

Also, since the dummy via hole 19b is in the slit shape, as described in the first embodiment, it is difficult that the material of the second metal layer 21 is satisfactorily embedded into the deep portion of the dummy via hole 19b. Therefore, the film quality of the second embedded metal layer 21 formed in the dummy via hole 19b becomes uneven and coarse. Therefore, the bonding between the second embedded metal layer 21 and the second barrier metal layer 20 in the dummy via hole 19b is low.

Since the dummy via hole 19d is made in the slit shape like the dummy via hole 19b, it is difficult that the material of the second barrier metal layer 20 is uniformly formed into the deep portion of the dummy via hole 19d. Therefore, a film thickness of the barrier metal layer 20 formed on the surface of the dummy via hole 19d becomes uneven, and film quality becomes coarse. Consequently, bonding between the barrier metal layer 20 in the dummy via hole 19d and the third interlayer insulating film 18 is low. Also, bonding between the barrier metal layer 20 in the dummy via hole 19d and the Cu diffusion preventing insulating film 17 is low. Further, bonding between the barrier metal layer 20 in the dummy via hole 19d and the second interlayer insulating film 13 is low.

Also, since the dummy via hole 19d is made in the slit shape like the dummy via hole 19b, It is difficult that the material of the second embedded metal layer 21 is satisfactorily embedded into the deep portion of the dummy via hole 19d. Therefore, the film quality of the second embedded metal layer 21 formed in the dummy via hole 19d becomes coarse. Consequently, the bonding between the second embedded metal layer 21 and the second barrier metal layer 20 in the dummy via hole 19d is low.

As shown in FIG. 13, the upper-layer interconnection 27 is formed on the third interlayer insulating film 18, and the upper-layer interconnection 27 is connected to the normal plug 22a and the dummy plugs 22b, 22c, and 22d. In the fourth embodiment, the same effects as those in the first embodiment are obtained by the dummy plug 22b. That is, provision of the dummy plug 22b creates the broken portion in the portion of the lower-layer interconnection 16 under the corner portion of the bottom portion of the dummy plug 22b, and the stress migration is generated by the broken portion. Therefore, the generation of the stress migration is suppressed in the portion of the lower-layer interconnection 16 of the bottom portion of the normal plug 22a, with the result that the void generation is suppressed in the normal plug 22a or in the portion of the lower-layer interconnection 16 under the corner portions of the bottom portion of the normal plug 22a.

Further, in the fourth embodiment, since the upper-layer interconnection 27 is connected to the dummy plug 22b, the stress migration is generated in the dummy plug 22b due to the coarseness of the dummy plug 22b, which generates the void in the dummy plug 22b. The generation of the stress migration in the dummy plug 22b further suppresses the generation of the stress migration in the normal plug 22a or in the portion of the lower-layer interconnection 16 of the bottom portion of the normal plug 22a, which suppresses the void generation in the normal plug 22a or in the portion of the lower-layer interconnection 16 under the corner portion of the bottom portion of the normal plug 22a.

Further, in the fourth embodiment, since the broken portion formed in the portion of the second interlayer insulating film 13 under the corner portion of the bottom portion of the dummy plug 22c is deeper than the broken portion formed in the portion of the lower-layer interconnection 16 under the corner portion of the bottom portion of the dummy plug 22b, the large stress migration is generated in the dummy plug 22c due to the coarseness of the dummy plug 22c. As a result, the generation of the stress migration is further suppressed in the normal plug 22a or in the portion of the lower-layer interconnection 16 under the corner portion of the bottom portion of the normal plug 22a, which suppresses the void generation in the normal plug 22a or in the portion of the lower-layer interconnection 16 under the corner portion of the bottom portion of the normal plug 22a.

Further, in the fourth embodiment, since the broken portion formed in the portion of the second interlayer insulating film 13 under the corner portion of the bottom portion of the dummy plug 22d is deeper than the broken portion formed in the portion of the lower-layer interconnection 16 under the corner portion of the bottom portion of the dummy plug 22b, the large stress migration is generated in the dummy plug 22d due to the coarseness of the dummy plug 22d. As a result, the generation of the stress migration is further suppressed in the normal plug 22a or in the portion of the lower-layer interconnection 16 under the corner portion of the bottom portion of the normal plug 22a, which suppresses the void generation in the normal plug 22a or in the portion of the lower-layer interconnection 16 under the corner portion of the bottom portion of the normal plug 22a.

Thus, according to the fourth embodiment, provision of the dummy plugs 22c and 22d further suppresses the stress migration in the normal plug 22a or in the portion of the lower-layer interconnection 16 under the corner portion of the bottom portion of the normal plug 22a, which further improves the reliability of the interconnection.

Figure 14:
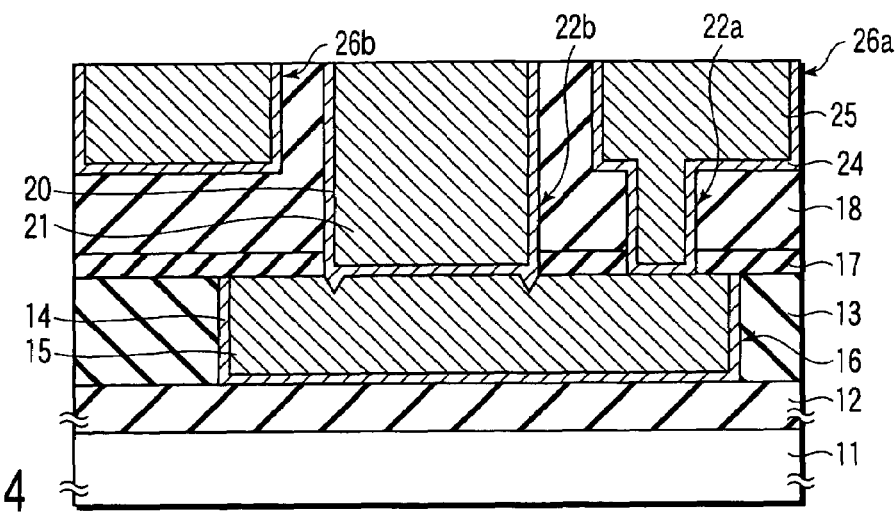
FIG. 14 is a cross sectional view of a semiconductor device in a manufacturing process according to a fifth embodiment of the present invention.

FIG. 14 is a cross sectional view showing a semiconductor device according to a fifth embodiment of the present invention. The semiconductor device of the fifth embodiment has a dual damascene structure. The same components as those in the first embodiment are designated by the same numerals, and the description will not be repeated.

The upper-layer interconnections 26a and 26b are shown in FIG. 14. The upper-layer interconnection 26a and the normal plug 22a are formed in the form of the dual damascene structure. The upper-layer interconnections 26a and 26b, the normal plug 22a and the dummy plug 22b are formed in the third interlayer insulating film 18. In FIG. 14, the interlayer insulating film 18 is formed in a single layer. Alternatively, the interlayer insulating film 18 may be formed in a laminated layer having two or more layers, and the upper-layer interconnections 26a and 26b, the normal plug 22a and the dummy plug 22b may be formed in the laminated layer. The normal plug 22a is formed in a via hole formed in a lower-layer portion of the interlayer insulating film 18, and the upper-layer interconnection 26a is formed in a groove formed in the upper-layer portion adjacent to the lower-layer portion of the interlayer insulating film 18. The normal plug 22a is not formed in the lower-layer and the upper-layer portions.

In the fifth embodiment, the dummy plug 22b is also provided on the lower-layer interconnection 16, and the same effects as those in the first embodiment are obtained by the dummy plug 22b. That is, provision of the dummy plug 22b creates the broken portion in the portion of the lower-layer interconnection 16 under the corner portion of the bottom portion of the dummy plug 22b, and the stress migration is generated by the broken portion. Therefore, the generation of the stress migration is suppressed in the portion of the lower-layer interconnection 16 of the bottom portion of the normal plug 22a, and the void generation is suppressed in the normal plug 22a or in the portion of the lower-layer interconnection 16 under the corner portions of the bottom portion of the normal plug 22, which allows the reliability of the interconnection to be further improved.

Figure 15:
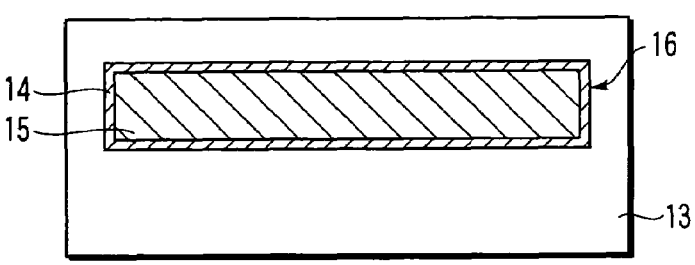
FIG. 15 is a plan pattern of a normal interconnection and a dummy interconnection of a semiconductor device in a manufacturing process according to a sixth embodiment of the present invention.
Figure 16:
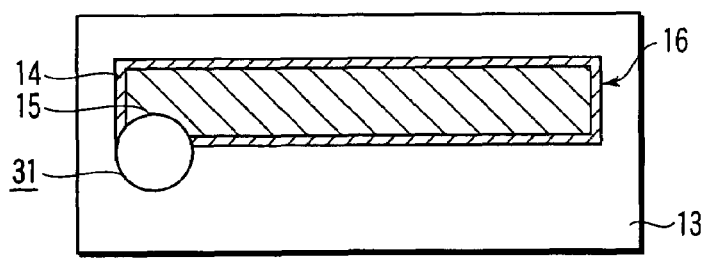
FIG. 16 is a plan pattern of the normal interconnection and the dummy interconnection of the semiconductor device in a manufacturing process following the manufacturing process of FIG. 15, according to the sixth embodiment of the present invention.
Figure 17:
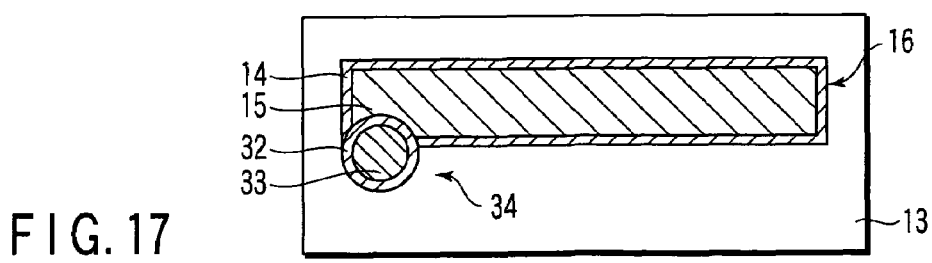
FIG. 17 is a plan pattern of the normal interconnection and the dummy interconnection of the semiconductor device in a manufacturing process following the manufacturing process of FIG. 16, according to the sixth embodiment of the present invention.
Figure 18:
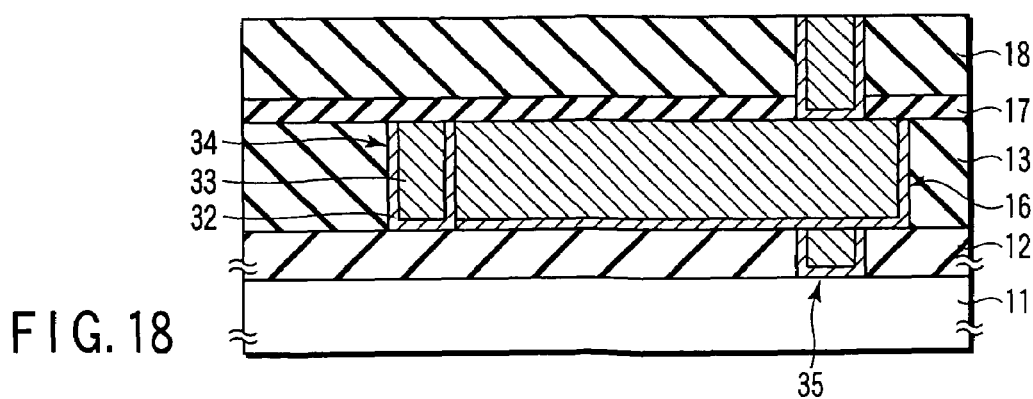
FIG. 18 is a cross sectional view of the semiconductor device shown in FIG. 17.

FIG. 15 to FIG. 17 are sectional views of a semiconductor device in a manufacturing process according to a sixth embodiment of the present invention. FIG. 18 is a sectional view showing the semiconductor device of the sixth embodiment. The same components as those in the first embodiment are designated by the same numerals, and the description will not be repeated. In the sixth embodiment, a dummy interconnection is formed. In the structure of the sixth embodiment, the same effect as the first embodiment is obtained.

Referring to FIG. 15 and FIG. 18, an interconnection groove is formed in the second interlayer insulating film 13, and the first barrier metal layer 14 and the interconnection material 15 made of Cu are embedded in the interconnection groove to form the lower-layer interconnection 16 by the damascene method. The lower-layer interconnection 16 is connected to a first normal plug 35 formed in the first interlayer insulating film 12 formed on the semiconductor substrate 11.

Referring to FIG. 16 and FIG. 18, a dummy interconnection groove 31 is formed in the second interlayer insulating film 13. The dummy interconnection groove 31 is connected to the interconnection material 15 of the lower-layer interconnection 16. The dummy interconnection groove 31 is provided in a plan view in the region which does not correspond to the first normal plug 35 and a second normal plug 22a. The dummy interconnection groove 31 has a size smaller than a minimum width of a minimum width interconnection in a plan pattern.

Referring to FIG. 17 and FIG. 18, a barrier metal layer 32 and an interconnection material 33 made of Cu are embedded in the dummy interconnection groove 31 to form a dummy interconnection 34 by the damascene method. Since the dummy interconnection groove 31 has a size smaller than a minimum width of a minimum width interconnection, the dummy interconnection 34 also has the size smaller than the minimum width of the minimum interconnection.

Since the size of the dummy interconnection groove 31 is smaller than the minimum width of a minimum width interconnection, it is difficult that a material of the barrier metal layer 32 is uniformly formed into a deep portion of the dummy interconnection groove 31. Therefore, a film thickness of the barrier metal layer 32 formed on the surface of the dummy interconnection groove 31 becomes uneven, and film quality becomes coarse. Consequently, bonding between the barrier metal layer 32 in the dummy interconnection groove 31 and the second interlayer insulating film 13 is low. Also, bonding between the barrier metal layer 32 in the dummy interconnection groove 31 and the interconnection material 15 of the lower-layer interconnection 16 is low. Further, bonding between the barrier metal layer 32 in the dummy interconnection groove 31 and the first interlayer insulating film 12 is low.

Also, since the size of the dummy interconnection groove 31 is smaller than the minimum width of a minimum width interconnection, it is difficult that the material of the interconnection material 33 is satisfactorily embedded into the deep portion of the dummy interconnection groove 31. Therefore, the film quality of the embedded interconnection material 33 formed in the interconnection groove 31 becomes uneven and coarse. Therefore, the bonding between the embedded interconnection material 33 and the barrier metal layer 32 in the dummy interconnection groove 31 is low.

In this embodiment, since the dummy interconnection 34 having the size smaller than the minimum width of the minimum interconnection is provided, voids are easily generated in the dummy interconnection 34. As a result, the stress migration easily occurs in the dummy interconnection 34, which suppresses the stress migration in the first and second normal plugs to improve the reliability of the interconnection.

In the above embodiments, Cu is used as the embedded metal layer material. However, the embedded metal layer material is not limited to Cu, and another material such as Al (aluminum), Ag (silver), and W (tungsten) which is generally used as the embedded interconnection material in the field of the semiconductor technology can be used as the embedded metal layer material. The material in which Al (aluminum), Ag (silver), W (tungsten), and the like are added to a principal component of Cu (copper) may be used as the embedded metal layer material. In the above embodiments, Ti is used as the barrier metal layer material. However, the barrier metal layer material is not limited to Ti, and another material such as TiN (titanium nitride) which is usually used as the barrier metal layer material in the field of the semiconductor technology can be used as the barrier metal layer material.

What is claimed is:

1. A semiconductor device comprising:
   a semiconductor substrate;
   a first interlayer insulating film formed on the semiconductor substrate, the first interlayer insulating film including a first groove;
   a lower-layer interconnection formed in the first groove of the first interlayer insulating film, the lower-layer interconnection including a first upper surface having a first and second upper portions;
   a second interlayer insulating film formed above the first interlayer insulating film and the lower-layer interconnection;
   a normal plug formed in the second interlayer insulating film, the normal plug including a first bottom surface connected to the first upper portion of the lower-layer interconnection;
   a dummy plug formed in the second interlayer insulating film, the dummy plug including a second bottom surface connected to the second upper portion of the lower-layer interconnection;
   a third interlayer insulating film formed on the second interlayer insulating film, the normal plug, and the dummy plug, the third interlayer insulating film including a second groove; and
   an upper-layer interconnection formed in the second groove of the third interlayer insulating film, the upper-layer interconnection including a third bottom surface connected to a second upper surface of the normal plug,
   wherein a third upper surface of the dummy plug is connected to a fourth bottom surface of the third interlayer insulating film without connection to the upper-layer interconnection, and the second upper portion of the lower layer interconnection includes a recess located under the dummy plug.

2. A semiconductor device according to claim 1, further comprising a second dummy plug embedded in a second dummy via hole formed in the second interlayer insulating film, the second dummy via hole opening to the first interlayer insulating film, wherein the normal plug in the plan pattern has a substantially circular shape and the second dummy plug in the plan pattern has a substantially circular shape.

3. A semiconductor device according to claim 2, wherein dimension of the normal plug in the plan pattern is substantially equal to dimension of the second dummy plug in the plan pattern.

4. A semiconductor device according to claim 1, further comprising a second dummy plug embedded in a second dummy via hole formed in the second interlayer insulating film, the second dummy via hole opening to the first interlayer insulating film, wherein a short side of the second dummy plug in a plan pattern is larger than the minimum width of the minimum width interconnection and smaller than the minimum diameter of the minimum diameter via hole and a long side of the second dummy plug in the plan pattern is larger than the shortest length of the shortest length interconnection.

5. A semiconductor device according to claim 2, wherein dimension of the first plug in the plan pattern is substantially equal to dimension of the second plug in the plan pattern.

6. A semiconductor device according to claim 1, wherein the lower-layer interconnection is formed of a first barrier metal layer and a first embedded metal layer, the normal plug is formed of a second barrier metal layer and a second embedded metal layer, and the upper-layer interconnection is formed of a third barrier metal layer and a third embedded metal layer.

7. A semiconductor device according to claim 6, wherein the first barrier metal layer of the lower-layer interconnection, the second barrier metal layer of the normal plug, and the third barrier metal layer of the upper-layer interconnection are made of Ti or TiN.

8. A semiconductor device according to claim 6, wherein the first embedded metal layer of the lower-layer interconnection, the second embedded metal layer of the normal plug, and the third embedded metal layer of the upper-layer interconnection are made of Cu, Al, Ag or W.

9. A semiconductor device according to claim 6, wherein the first embedded metal layer of the lower-layer interconnection, the second embedded metal layer of the normal plug, and the third embedded metal layer of the upper-layer interconnection are made of a material in which principal component is Cu.

10. A semiconductor device according to claim 9, wherein the material in which principal component is Cu contains any one of Al, Ag and W.

11. A semiconductor device according to claim 1, wherein the first upper portion includes a smooth surface.

12. A semiconductor device according to claim 1, wherein the recess is formed at a portion corresponding to a side end of the dummy plug.

13. A semiconductor device according to claim 1, wherein a stress migration is occurred at the second upper portion of the lower-layer interconnection.

14. A semiconductor device according to claim 1, wherein the normal plug includes a circular shape.

15. A semiconductor device according to claim 1, wherein the dummy plug includes a slit shape.

16. A semiconductor device according to claim 15, wherein the dummy plug includes a short-side length which is larger than a minimum width of a minimum width interconnection and smaller than a minimum diameter of a minimum diameter via hole.

17. A semiconductor device according to claim 15, wherein the dummy plug includes a long-side length which is larger than a shortest length of a shortest length interconnection.

* * * * *